Nov. 28, 1967 G. F. PENVER 3,355,595

ODD-NUMBER COUNTER

Filed Oct. 9, 1964 2 Sheets-Sheet 1

INVENTOR
GILBERT FRANCIS PENVER

BY

ATTORNEYS

INVENTOR
GILBERT FRANCIS PENVER
BY Hane and Nydick
ATTORNEYS

United States Patent Office 3,355,595

Patented Nov. 28, 1967

3,355,595
ODD-NUMBER COUNTER

Gilbert Francis Penver, Clayhall, England, assignor to Advance Electronics Limited (formerly Advance Components Limited)

Filed Oct. 9, 1964, Ser. No. 402,700
Claims priority, application Great Britain, Oct. 29, 1963, 42,605/63
6 Claims. (Cl. 307—88.5)

ABSTRACT OF THE DISCLOSURE

An odd-number counter including bi-stable pairs of active devices. The signal input from a source to each device is controlled by steering means biased from another device, and a diode connection between like electrodes of two of the active devices induces odd-number counting.

The present invention relates to counting and dividing circuit arrangements and more particularly to such arrangements comprising a plurality of binary counting stages arranged to form a ring counter.

In a binary counting stage comprising a pair of cross-coupled switching elements such as vacuum tubes or transistors it is known to employ diodes as "steering" elements to ensure that successive input pulses applied in common to both switching elements are effective only on one such switching element at a time, to bring about reversal of state of the two switching elements in response to each input pulse.

The invention contemplates the use of this technique of diode steering in ring counters composed of binary stages, not to steer successive pulses to alternative elements of a single stage but to steer pulses to successively different stages thereby to establish a counting pattern, without the use of the more conventionally used feedback arrangements, which enables economies in the number of switchng elements required for a given scale of count or factor of division and permits division by an odd number or counting to odd number scale.

The various features and advantages of the invention will be apparent from the following description of some exemplary embodiments thereof taken in conjunction with the accompanying drawings in which.

The diode-steered binary stage of FIGURE 1 consists of a conventional transistor Eccles-Jordan binary stage comprising two p-n-p transistors TR1, TR2 arranged in identical circuits of which only that of transistor TR1 will be described. The common pulse input is at the junction of two capacitors such as C1, each of which is connected to the junction of a pair of diodes D1, D2 connected in series between collector and base of the transistor. Diode D1 is shunted by a resistor R1. Resistor R2 is the collector load of transistor TR1 and is connected to the negative supply line. The two transistors are cross connected by circuits of which resistor R3 is part.

When the circuit is switched on one of the transistors will assume a conductive state before the other and hold the other in non-conductive state. Assuming transistor TR1 is initially conducting, its collector is at near ground potential and so is the junction between capacitor C1, and diodes D1, D2. The application of a positive going pulse to the common input causes the potential at the junction of capacitor C1 and diodes D1, D2 to rise so that diode D2 conducts and transistor TR1 is cut off. Transistor TR2 is made conductive as transistor TR1 is cut off due to the cross coupling between the transistor stages and thus the binary stage is reversed.

During the input pulse the cutting off of transistor TR1 causes its collector to go negative and the potential at the junction of capacitor C1, and diode D1 will tend to follow. The negative going portion of the input pulse causes diode D1 to conduct and restore this potential to negative supply level if this has not already taken place during the pulse. This negative excursion of the input is also applied to transistor TR2 but has no effect as transistor TR2 is already conducting.

Upon arrival of the next input pulse the positive going portion has no effect on transistor TR1 because associated diode D2 is back biased by the potential at the junction of capacitor C1 and diodes D1, D2. The effect on transistor TR2 is as described for the first signal pulse in relation to transistor TR1. It will be seen that the criteria for a transistor to be switched by an input pulse are:

(i) The transistor must be conducting, and (ii) The associated steering diode D2 must not be back-biased.

Figure 1:
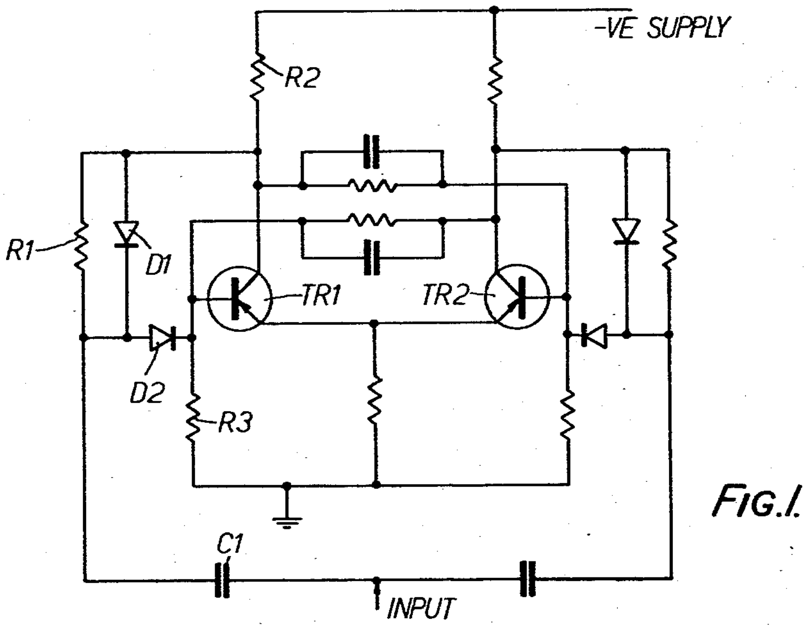
FIGURE 1 is a circuit diagram of a known diode steered binary stage.
Figure 2:
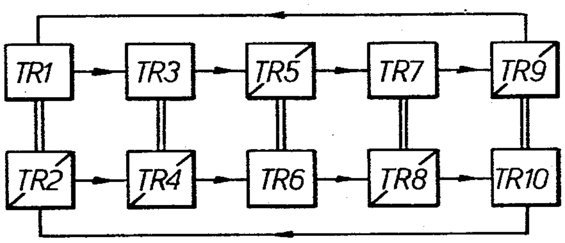
FIGURE 2 is a schematic diagram of one form of decade counter using the circuit of FIGURE 1.

These two criteria are employed in the decade counter of FIGURE 2 which comprises five binary stages of the type shown in FIGURE 1 but with the diode steering circuits arranged to steer successive input pulses in the manner indicated by the single line arrowed connections between the blocks. Each block represents a transistor switching element and the two elements constituting a binary stage are shown linked together by double lines which can be considered as a diagrammatic representation of cross coupling.

Assuming that the various binary elements 1; 2; 3; 4; 5 and 6 and so on, are initially in the states where transistors TR1, TR3, TR7, TR6 and TR10 are conducting and their corresponding binary complements are therefore non-conducting, as indicated by the diagonal line through the block representing a transistor stage, the only stage possessing the required criteria is transistor TR3 which being conducting is also receiving a priming from transistor TR1 in conducting state. Thus an input counting impulse can only affect transistor TR3 and cause the binary stage comprising transistor TR3, TR4 to reverse its state. When this has occurred, transistor TR6 being in conducting state receives a primary from transistor TR4, which has just switched to conducting state, and is the only transistor possessing the required criteria. Thus the second input impulse is effective to reverse the state of the binary stage comprising transistors TR5, TR6 and this stage alone. The states of the various transistors at each counting step are indicated in the following table, wherein O indicates the conductive state and X the non-conductive state and the suffix *p* denotes that stage receiving priming:

third input pulse the binary stage comprising transistors TR1, the diode link between transistors TR2 and TR3 ing for transistor TR2. In response to a fourth input pulse transistors TR2, TR5 reverses and transistor TR5 provides priming for transistor TR3. In response to a fifth input pulse binary stage comprising transistors TR3, TR6 reverses to restore the initial state.

TABLE I

| Input Pulse No. | TR1 | TR3 | TR5 | TR7 | TR9 | TR2 | TR4 | TR6 | TR8 | TR10 |
|---|---|---|---|---|---|---|---|---|---|---|
| 0 | O | O*p* | X | O | X | X | X | O | X | O |
| 1 | O | X | X | O | X | X | O | O*p* | X | O |
| 2 | O | X | O | O*p* | X | X | O | X | X | O |
| 3 | O | X | O | X | X | X | O | X | O | O*p* |
| 4 | O*p* | X | O | X | O | X | O | X | O | X |
| 5 | X | X | O | X | O | O | O | X | O | X |
| 6 | X | O | O*p* | X | O | O | X | X | O | X |
| 7 | X | O | X | X | O | O | X | O | O*p* | X |
| 8 | X | O | X | O | O*p* | O | X | O | X | X |
| 9 | X | O | X | O | X | O*p* | X | O | X | O |
| 10 | O | O | X | O | X | X | X | O | X | O |

To ensure the initial condition assumed, the resistor R3 associated with each transistor which should be conducting at the commencement, may be momentarily connected to the negative supply instead of ground.

The above described circuit affords a decade counter employing ten transistors the maximum speed of operation of which is dependent upon the switching response time of any one of the binary state.

Figure 3:
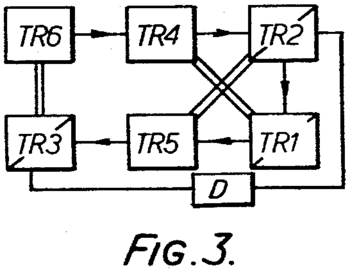
FIGURE 3 is a schematic diagram of a divide-by-five circuit which can be used in a decade counter.

An economy in the number of transistors required for a decade counter and in the number of such transistors of which a fast switching action is required for high counting speeds is possible using the circuit of FIGURE 3. This circuit is a divide-by-five circuit, or a scale of five counter comprising three binary stages each formed of two transistors with diode steering to control the sequence of switching operations.

The conventions of FIGURE 2 apply also to FIGURE 3 wherein the three binary stages are constituted by transistors n-p-n TR1, TR4; TR2, TR5; and TR3, TR6, and there is also a diode coupling between the collectors of transistors TR2 and TR3 (indicated by element D connected to transistors TR2 and TR3) which is of such polarity that transistor TR2 conducts, the diode link conducts and lowers the potential on the collector of transistor TR3. This cuts off transistor TR6, and transistor TR3 becomes conducting with transistor TR2.

Assuming that initially transistors TR4, TR5 and TR6 are conducting and the other thus cut-off, transistor TR4 is the only conductive transistor receiving a priming from a conductive transistor, TR6 in this case. Thus in response to a first input pulse the binary stage comprising transistor TR1, TR4 reverses and transistor TR1 provides priming for transistor TR5. In response to a second input pulse the binary stage comprising transistors TR2, TR5 reverses and due to the diode link between the collectors of transistors TR2 and TR3, stage comprising transistors TR3, TR6 also reverses. Transistor TR2 now provides priming for transistor TR1 and in response to the The conditions of the various transistors at each counting stage are indicated in the following table:

TABLE II

| Input Pulse No. | TR1 | TR2 | TR3 | TR4 | TR5 | TR6 |
|---|---|---|---|---|---|---|
| 0 | X | X | X | O*p* | O | O |
| 1 | O | X | X | X | O*p* | O |
| 2 | O*p* | O | O | X | X | X |
| 3 | X | O*p* | O | O | X | X |
| 4 | X | X | O*p* | O | O | X |
| 5 | X | X | X | O | O | O |

It will be appreciated that the scale-of-five counter above described can be used with a further binary stage serving as a decade counter, the further stage serving to halve the number of input pulses applied to the scale-of-five counter whereby a slower response is permissible in the counter stages without reduction of the overall counting speed of the decade. Put another way, the stringent requirements of the transistors for high speed counting need only be met by the two transistors forming the input binary stage. The further stage could, of course, have the number of output pulses by being connected to the final stage of the scale-of-five counter. Such a decade counter employs only eight transistors in comparison with the ten required for the decade of FIGURE 2.

Figure 4:
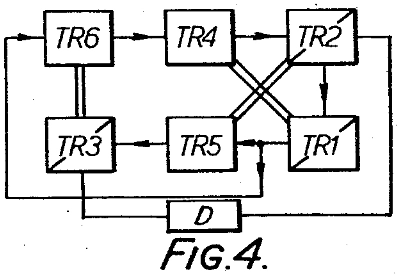
FIGURE 4 is a schematic diagram of a modified form of the circuit of FIGURE 3.
Figure 5:
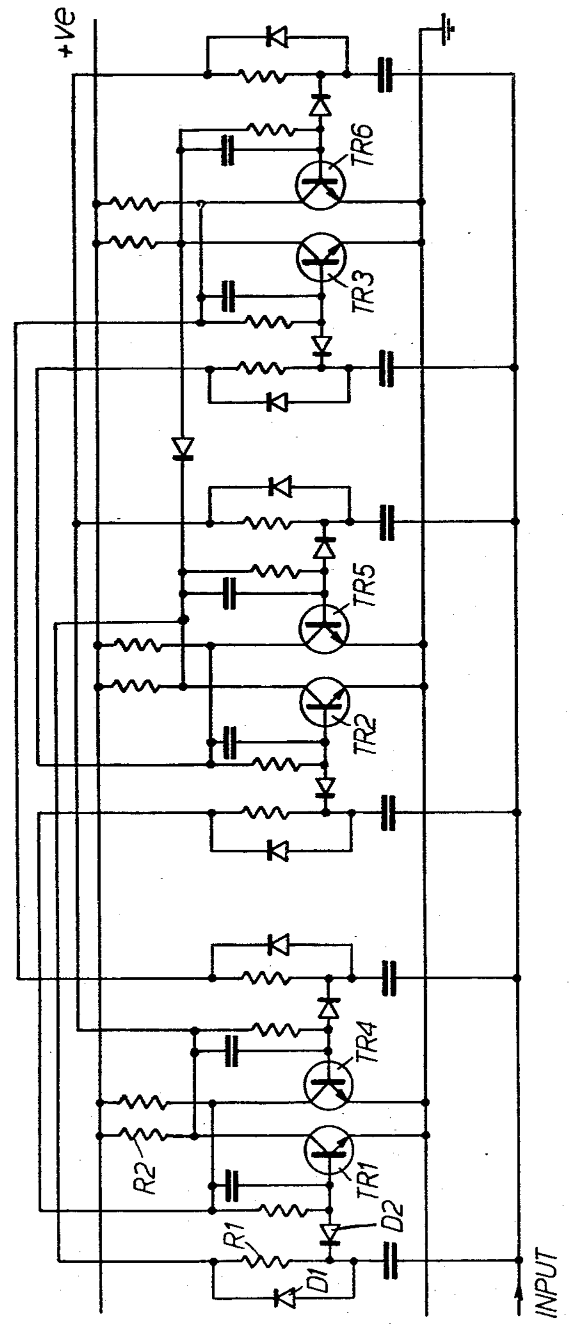
FIGURE 5 is a circuit diagram of the divide-by-five circuit shown in FIGURE 4.

A modified version of the scale-of-five counter of FIGURE 3 is shown diagrammatically in FIGURE 4 and in full in FIGURE 5 (employing n-p-n) and this modified version is capable of more rapid operation than that of FIGURE 3. In this modified version transistor TR6 is also fed with input pulses and is primed by transistor TR1, the diode link between transistors TR2 and TR3 being retained. The diode link is still necessary because input pulse No. 2 goes to the bases of both of the transistors TR3 and TR6 (steered by TR5 and TR1) respectively. The binary stage comprising transistors TR3/TR6 does not therefore change its state due to the input pulse but since the pulse appears amplified and inverted on the collector of transistor TR6, this collector goes negative somewhat earlier than it would otherwise have done were it dependent on the changeover of the binary stage comprising transistors TR3/TR6 caused by the diode link from transistor TR2. This negative excursion removes the steering from transistor TR4. If this steering is still present at pulse No. 3, transistor TR1 is also receiving the input pulse (steered by transistor TR2) and the binary stage comprising transistors TR1/TR4 will not change its state. Table II with the addition of the suffix *p* to the O of transistor TR6 at input pulse 1 time gives an indication of the states of the transistors at each counting step in the modified version of FIGURE 4.

I claim:

1. An odd-number counter comprising:

an even number of active circuit elements having electrodes;

circuit means for coupling said circuit elements in bistable pairs, each of said bistable pairs developing differing bias potentials in the two conditions thereof;

bias responsive diode steering means associated with each said element, each said steering means having an unbiased condition for permitting applied signals to pass to said element to change the state of a said bistable pair and having a biased condition for diverting said signals from said element;

a source of spaced input signals;

circuit means for coupling input signals from said source simultaneously to each of said steering means;

circuit means for coupling each of said steering means to receive a bias potential from one of said bistable pairs; and further circuit means for coupling one of said steering means to receive also a bias potential from another of said bistable pairs, whereby a cycle of unique conditions of said bistable pairs is completed in response to an odd number of said input signals.

2. A counter as claimed in claim 1 wherein each of said diode steering means includes:

a first diode and a second diode;

means for connecting said first diode between said source and said element; and means for connecting said second diode between said first diode and said further element whereby when said other bistable pair is in a predetermined one of its stable conditions said first diode is forward biased to pass signals from said source to said element and when said other bistable pair is in the other of its stable conditions said first diode is blocked to prevent signals from said source from passing to said element.

3. A counter as claimed in claim 1 wherein said further circuit means includes a diode coupling like electrodes of elements in different ones of said bistable pairs.

4. A quinary counter comprising the combination of:

first, second, third, fourth, fifth and sixth active circuit devices, each of said devices including a set of different electrodes;

means for coupling said first and fourth, second and fourth, and third and sixth active devices in respective bistable pairs;

a source of spaced input signals;

diode steering means associated with each said device, each said steering means having an unbiased condition permitting applied signals to pass to said device to change the state of a said bistable pair and having a biased condition diverting said signals from said device;

circuit means for coupling input signals from said source to each of said steering means;

circuit means for coupling said first steering means to receive a bias potential from said second active device;

circuit means for coupling said second steering means to receive a bias potential from said fourth active device;

circuit means for coupling said third steering means to receive a bias potential from said fifth active device;

circuit means for coupling said fourth steering means to receive a bias potential from said sixth active device;

circuit means for coupling said fifth steering means to receive a bias potential from said first active device; and diode means for coupling like electrodes of said second and third active devices.

5. A quinary counter in accordance with claim 4 wherein said sixth steering means is also coupled to receive a bias potential from said first active device.

6. A quinary counter in accordance with claim 4 wherein each of said active devices is a transistor having a collector, and emitter and a base, and wherein the means coupling said transistors to form said bistable pairs comprises:

a source of direct current having positive and negative terminals;

an individual resistor connecting the collector of each said transistors to a terminal of said source;

a direct connection between the emitter of each of said transistors and the other terminal of said source;

an individual parallel combination of a capacitor and a resistor coupling the collector of each transistor of a said bistable pair to the base of the other transistor of said pair;

wherein the diode steering means associated with each of said transistors comprises, a series combination of first and second diodes in like polarity connected between the base of a said transistor in one of said pairs and the collector of a said transistor in another of said pairs; and wherein the means coupling said signals source to said steering means comprises an individual capacitor connected between said source and the junction between the two diodes of each of said series combinations.

References Cited

UNITED STATES PATENTS

| | | | |
|---|---|---|---|
| 2,540,024 | 1/1951 | Bergfors | 328—45 |
| 3,151,252 | 9/1964 | Leightner | 307—88.5 |

ARTHUR GAUSS, *Primary Examiner.*

D. D. FORRER, *Assistant Examiner.*